(12) United States Patent
Bohannon et al.

(10) Patent No.: US 8,975,962 B2
(45) Date of Patent: Mar. 10, 2015

(54) SLEW-ENHANCED OPERATIONAL TRANSCONDUCTANCE AMPLIFIER

(71) Applicant: Synaptics Incorporated, San Jose, CA (US)

(72) Inventors: Eric Scott Bohannon, Henrietta, NY (US); Marshall J Bell, Dripping Springs, TX (US)

(73) Assignee: Synaptics Incorporated, San Jose, CA (US)

( * ) Notice: Subject to any disclaimer, the term of this patent is extended or adjusted under 35 U.S.C. 154(b) by 72 days.

(21) Appl. No.: 13/922,187

(22) Filed: Jun. 19, 2013

(65) Prior Publication Data

US 2014/0375384 A1 Dec. 25, 2014

(51) Int. Cl.
*H03F 3/45* (2006.01)
*H03F 3/217* (2006.01)

(52) U.S. Cl.
CPC .................................. *H03F 3/2171* (2013.01)
USPC .......................................... 330/257; 330/261

(58) Field of Classification Search
USPC ................................... 330/257, 261, 260, 252
See application file for complete search history.

(56) References Cited

U.S. PATENT DOCUMENTS

| 5,070,307 A | 12/1991 | Ta |
| 6,414,552 B1 | 7/2002 | Kronmueller et al. |
| 6,670,941 B2 | 12/2003 | Albu et al. |
| 6,771,126 B2* | 8/2004 | Blankenship et al. ........ 330/257 |
| 7,034,615 B2* | 4/2006 | Moon ........................... 330/253 |
| 7,362,173 B1 | 4/2008 | Knausz |
| 7,429,972 B2 | 9/2008 | Choi et al. |
| 7,443,237 B1 | 10/2008 | Liu |
| 7,652,538 B2 | 1/2010 | Choi |
| 8,159,302 B2* | 4/2012 | Yeh et al. ...................... 330/257 |
| 2014/0266449 A1* | 9/2014 | Montazer ..................... 330/261 |

* cited by examiner

*Primary Examiner* — Henry Choe
(74) *Attorney, Agent, or Firm* — Patterson + Sheridan, LLP

(57) ABSTRACT

Embodiments of the invention are generally directed to improving the slew rate of an amplifier as the amplifier charges or discharges a capacitive load. In one embodiment, the amplifier is coupled to a slew-enhancing circuit which uses a control signal from the amplifier to aid the amplifier when charging or discharging the load. For example, the control signal may be an internal voltage used by the amplifier to control circuit elements within the amplifier. By routing the control signal to the slew-enhancing circuit, the control signal biases the circuit elements within the slew-enhancing circuit to source a boost current when charging the capacitive load or sink the boost current when discharging the capacitive load.

20 Claims, 9 Drawing Sheets

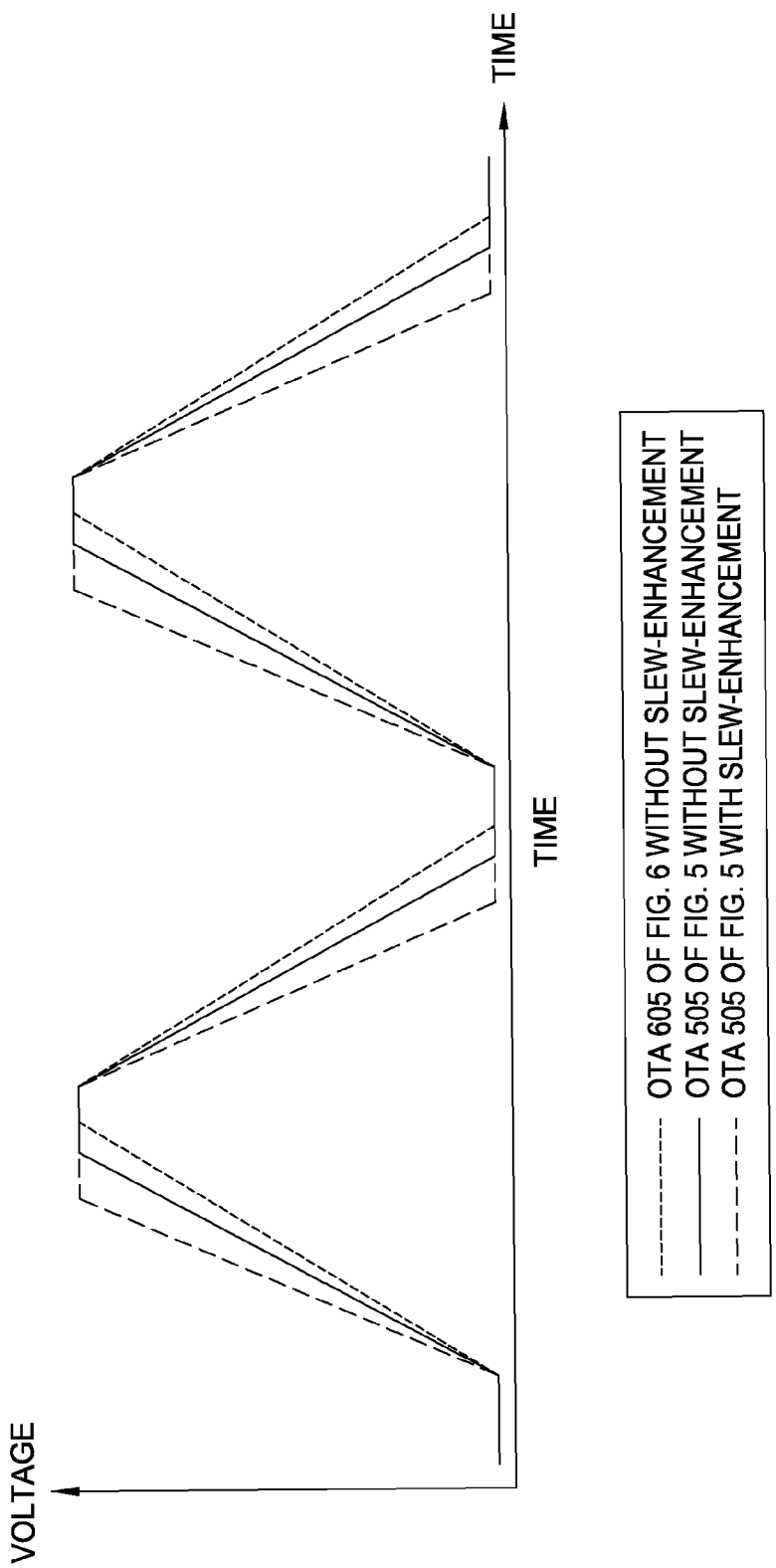

SLEW-ENHANCED OPERATIONAL TRANSCONDUCTANCE AMPLIFIER

BACKGROUND OF THE INVENTION

1. Field of the Invention

Embodiments of the present invention generally relate to increasing the slew rate of an amplifier, and more specifically, to providing additional current to a capacitive load using a slew-enhancing circuit.

2. Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY OF THE INVENTION

One embodiment described herein is a circuit that includes an operational transconductance amplifier (OTA) configured to alter a charge of a capacitive load using an output current. The circuit also includes a slew-enhancing circuit and a signal line configured to transmit a control signal from the OTA to a switching element in the slew-enhancing circuit. Furthermore, the slew-enhancing circuit is configured to use the control signal to generate a boost current that is separate from the output current to alter the charge of the capacitive load.

Another embodiment described herein is an integrated circuit including an OTA configured to alter a charge of a capacitive load using an output current. The integrated circuit also includes a slew-enhancing circuit and a signal line configured to transmit a control signal from the OTA to a switching element in the slew-enhancing circuit. The slew-enhancing circuit is configured to use the control signal to generate a boost current that is separate from the output current to alter the charge of the capacitive load. Furthermore, the OTA, the slew-enhancing circuit, and the signal line are integrated onto a chip.

Another embodiment described herein is a method for changing the slew rate associated with an OTA coupled to a capacitive load. The method includes transmitting a control signal from the OTA to a slew-enhancing circuit and biasing a switching element in the slew-enhancing circuit using the control signal. The method includes generating a boost current, separate from an output current from the OTA, in response to biasing the switching element using the control signal and providing the boost current from the slew-enhancing circuit and the output current to the capacitive load.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 10 is a timing diagram illustrating the slew rate of amplifiers with and without the slew-enhancing circuit, according to an embodiment described herein.

Figure 1:
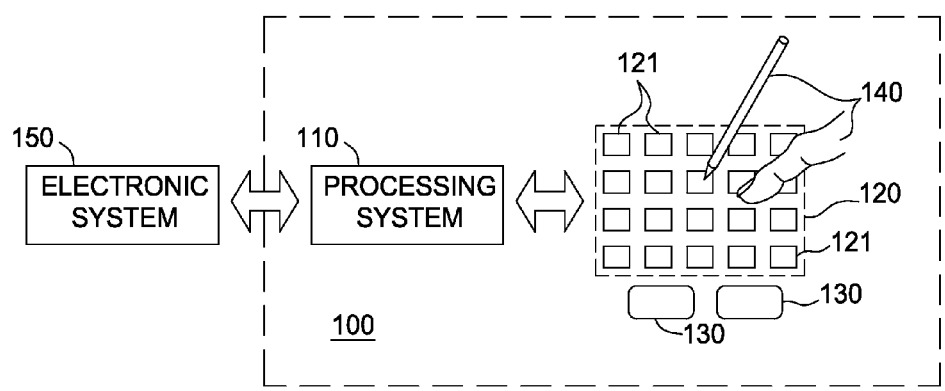
FIG. 1 is a schematic block diagram of an exemplary input device, according to an embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present technology provide input devices and methods for improving usability. Specifically, the embodiments are generally directed to improving the slew rate of an amplifier as the amplifier charges or discharges a capacitive load. In one embodiment, the amplifier is coupled to a slew-enhancing circuit which aids the amplifier when charging or discharging the load based on a control signal provided by the amplifier. For example, the control signal may be an internal voltage used by the amplifier to control circuit elements within the amplifier. By routing the control signal to the slew-enhancing circuit, the control signal biases the circuit elements within the slew-enhancing circuit to source current when charging the capacitive load or sink current when discharging the capacitive load.

In one embodiment, the slew-enhancing circuit may have a charging portion that is activated by the control signal when the amplifier is charging a capacitive load and a discharging portion that is activated when the amplifier is discharging a capacitive load. However, in other embodiments, the slew-enhancing circuit may be configured to either charge the capacitive load or discharge the capacitive load, but not both. Moreover, during small signal conditions when the amplifier is neither charging nor discharging the capacitive load, the slew-enhancing circuit may provide very little, if any, current to the capacitive load thereby reducing the amount of power drawn by the slew-enhancing circuit. That is, the slew-enhancing circuit may draw little quiescent power during the small signal condition. In one embodiment, the slew-enhancing circuit is essentially off or deactivated during small-signal conditions.

In one embodiment, the dimensions of a circuit element in the slew-enhancing circuit may be designed to generate a current that is M times greater than the current generated by the amplifier. For example, if the output current of the amplifier is currently discharging the capacitive load by sinking X microamps ($\mu A$), the slew-enhancing circuit may aid this process by sinking $M*X$ $\mu A$.

FIG. 1 is a block diagram of an exemplary input device 100, in accordance with embodiments of the present technology. Although embodiments of the present disclosure may be utilized in an input device 100 including a display device integrated with a sensing device, it is contemplated that the invention may be embodied in display devices without integrated sensing devices. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements 121 for detecting user input. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements 121 pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements 121 to create electric fields. In some capacitive implementations, separate sensing elements 121 may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitter electrodes or receiver electrodes, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen of the display device 101. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device 101 may share physical elements. For example, some embodiments may utilize some of the same electrical components for displaying and sensing. As another example, the display device 101 may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
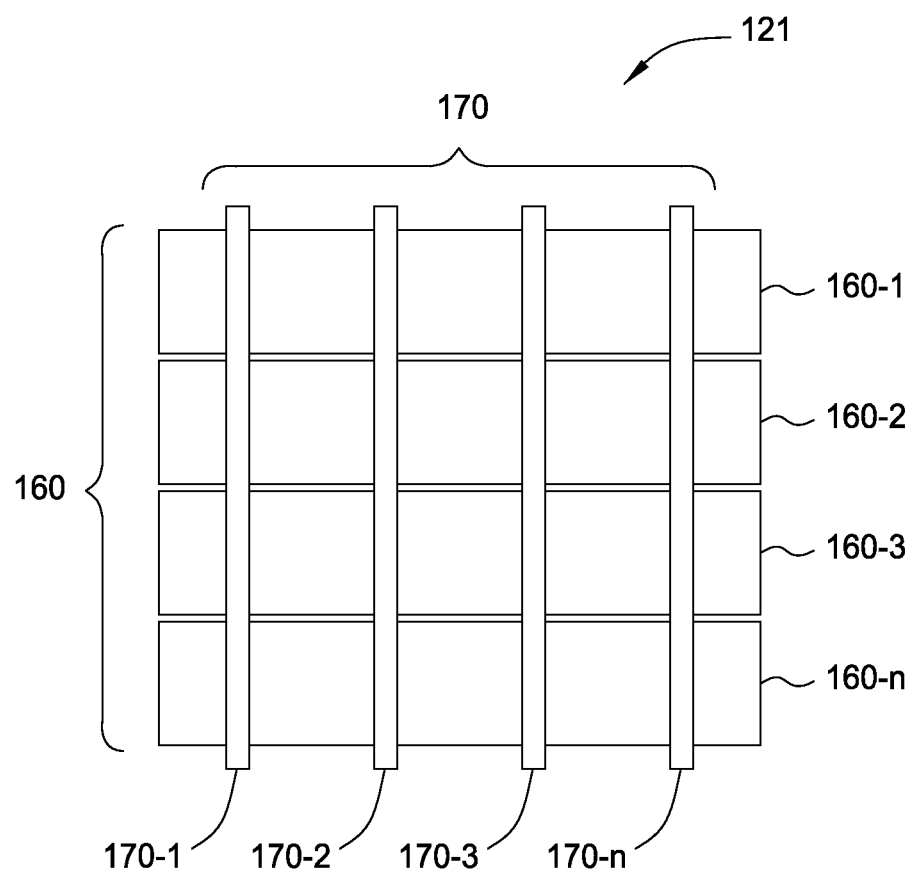
FIG. 2 illustrates a stack-up of a sensor assembly that may be used in the input device to sense the input object, according to an embodiment described herein.

FIG. 2 shows a portion of an exemplary pattern of sensing elements 121 configured to sense in a sensing region associated with the pattern, according to some embodiments. For clarity of illustration and description, FIG. 2 shows the sensing elements 121 in a pattern of simple rectangles, and does not show various components. This pattern of sensing elements 121 comprises a first plurality of sensor electrodes 160 (160-1, 160-2, 160-3, . . . 160-*n*), and a second plurality of sensor electrodes 170 (170-1, 170-2, 170-3, . . . 170-*n*) disposed over the plurality of transmitter electrodes 160. In one embodiment, this pattern of sensing elements 121 comprises a plurality of transmitter electrodes 160 (160-1, 160-2, 160-3, . . . 160-*n*), and a plurality of receiver electrodes 170 (170-1, 170-2, 170-3, . . . 170-*n*) disposed over the plurality of transmitter electrodes 160. In another embodiment, the first plurality of sensor electrodes may be configured to transmit and receive and the second plurality of sensor electrodes may also be configured to transmit and receive.

Transmitter electrodes 160 and receiver electrodes 170 are typically ohmically isolated from each other. That is, one or more insulators separate transmitter electrodes 160 and receiver electrodes 170 and prevent them from electrically shorting to each other. In some embodiments, transmitter electrodes 160 and receiver electrodes 170 are separated by insulative material disposed between them at cross-over areas; in such constructions, the transmitter electrodes 160 and/or receiver electrodes 170 may be formed with jumpers connecting different portions of the same electrode. In some embodiments, transmitter electrodes 160 and receiver electrodes 170 are separated by one or more layers of insulative material. In some other embodiments, transmitter electrodes 160 and receiver electrodes 170 are separated by one or more substrates; for example, they may be disposed on opposite sides of the same substrate, or on different substrates that are laminated together.

The areas of localized capacitive coupling between transmitter electrodes 160 and receiver electrodes 170 may be termed "capacitive pixels." The capacitive coupling between the transmitter electrodes 160 and receiver electrodes 170 change with the proximity and motion of input objects in the sensing region associated with the transmitter electrodes 160 and receiver electrodes 170.

In some embodiments, the sensor pattern is "scanned" to determine these capacitive couplings. That is, the transmitter electrodes 160 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and effectively produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 170 to be independently determined.

The receiver sensor electrodes 170 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

The background capacitance of a sensor device is the capacitive image associated with no input object in the sensing region. The background capacitance changes with the environment and operating conditions, and may be estimated in various ways. For example, some embodiments take "baseline images" when no input object is determined to be in the sensing region, and use those baseline images as estimates of their background capacitances.

Capacitive images can be adjusted for the background capacitance of the sensor device for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, transmitter electrodes 160 comprise one or more common electrodes (e.g., "V-com electrode" or source drive electrode) used in updating the display of the display screen. These common electrodes may be disposed on an appropriate display screen substrate. For example, the common electrodes may be disposed on the TFT glass in some display screens (e.g., In Plane Switching (IPS) or Plan to Line Switching (PLS)), on the bottom of the color filter glass of some display screens (e.g., Patterned Vertical Alignment (PVA) or Multi-domain Vertical Alignment (MVA)), etc. In such embodiments, the common electrode can also be referred to as a "combination electrode", since it performs multiple functions. In various embodiments, each transmitter electrode 160 comprises one or more common electrodes. In other embodiments, at least two transmitter electrodes 160 may share at least one common electrode.

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In some embodiments where the two rates differ, successive capacitive images are acquired at different display updating states, and the different display updating states may affect the capacitive images that are acquired. That is, display updating affects, in particular, the background capacitive image. Thus, if a first capacitive image is acquired when the display updating is at a first state, and a second capacitive image is acquired when the display updating is at a second state, the first and second capacitive images may differ due to differences in the background capacitive image associated with the display updating states, and not due to changes in the sensing region. This is more likely where the capacitive sensing and display updating electrodes are in close proximity to each other, or when they are shared (e.g. combination electrodes). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer of the display frame rate.

For convenience of explanation, a capacitive image that is taken during a particular display updating state is considered to be of a particular frame type. That is, a particular frame type is associated with a mapping of a particular capacitive sensing sequence with a particular display sequence. Thus, a first capacitive image taken during a first display updating state is considered to be of a first frame type, a second capacitive image taken during a second display updating state is considered to be of a second frame type, a third capacitive image taken during a first display updating state is considered to be of a third frame type, and so on. Where the relationship of display update state and capacitive image acquisition is periodic, capacitive images acquired cycle through the frame types and then repeats. In some embodiments, there may be "n" capacitive images for every display updating state.

Increasing the Slew Rate of an Amplifier

Figure 3:
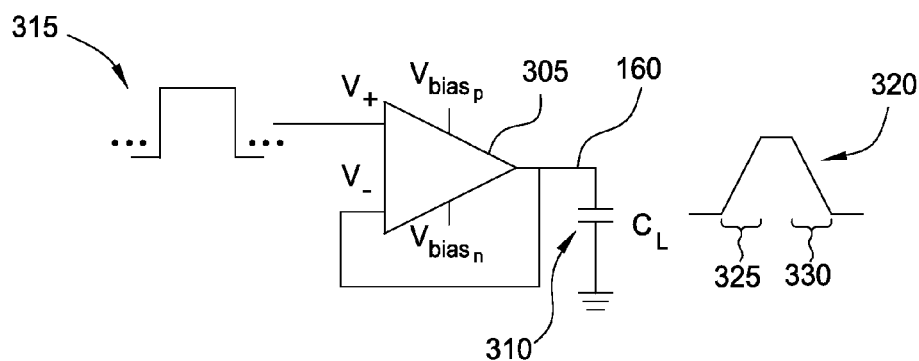
FIG. 3 is a circuit model of an amplifier coupled to a capacitive load, according to an embodiment described herein.

FIG. 3 is a circuit model of an amplifier 305 coupled to a capacitive load 310, according to an embodiment described herein. Here, the capacitive load 310 may be the capacitance of the transmitter electrode 160. As discussed above, the transmitter electrode 160 may be used to carry a transmitter signal used to perform touch sensing. For example, amplifier 305 may be a driver or buffer used to generate the transmitter signal on the electrode 160. The input device may provide a pre-amplified signal 315 (e.g., a square wave) that is then amplified by amplifier 305 resulting in an amplified signal 320 that may be used as the transmitter signal to perform touch sensing. The present embodiments, however, are not limited to this example and may be applicable to any system or input device that uses amplifiers.

The slew rate of amplifier 305 (e.g., the change of voltage with respect to time—dv/dt) may be defined as I(t)/C where I(t) is the current used to charge the capacitive load 310 and C is the capacitance of the load 310. Amplified signal 320 illustrates a rising slew rate 325 when charging the capacitive load 310 and a falling slew rate 330 when discharging load 310. Slew rate 325 may be increased by increasing the amount of current output from the amplifier 305. Stated differently, sourcing additional current to the capacitive load 310 charges the capacitive load 310 thereby increasing the slew rate 325 by decreasing the amount of time required for the output of amplifier 305 to respond to a voltage change at the non-inverting input (V-F). A similar advantage may occur if the amplifier 310 sinks additional current in order to discharge the capacitive load 310 to lower the voltage on electrode 160. Thus, by designing the amplifier 305 to source or sink additional current, the slew rates 325 and 330 may be increased (i.e., have a steeper slope or greater rate of change dv/dt).

Figure 4:
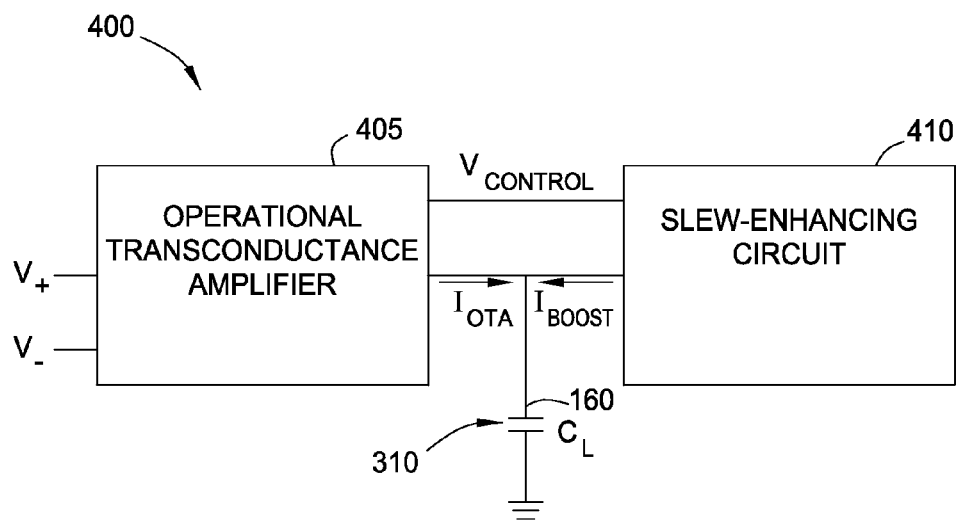
FIG. 4 is a schematic block diagram of an operational transconductance amplifier with a slew-enhancing circuit, according to an embodiment described herein.

FIG. 4 is a schematic block diagram of an operational transconductance amplifier (OTA) 405 with a slew-enhancing circuit 410, according to an embodiment described herein. Although OTA 405 and slew-enhancing circuit 410 are shown as separate elements, in some embodiments these elements may be integrated into a single amplifier. In one embodiment, OTA 405 and circuit 410 are contained in an integrated circuit.

Generally, OTA 405 outputs a current based on the difference between the input voltages V+ and V−. OTA 405 can either source current to provide charge to the capacitive load 310 or sink current to pull charge from the capacitive load 310. Doing so controls the voltage across the capacitor 310. As shown here, output current ($I_{OTA}$) from OTA 405 charges the capacitive load 310 thereby increasing the voltage on the electrode 160. To increase the voltage across the capacitive load 310 faster, circuit 400 includes the slew-enhancing circuit 410 which provides a boost current ($I_{BOOST}$). Here, the slew-enhancing circuit 410 provides additional current that charges the capacitive load 310 faster relative to using only the output current $I_{OTA}$ from OTA 405. This reduces the time needed to charge the capacitive load 310, and thus, increases the slew rate (dv/dt).

OTA 405 may provide at least one biasing or control voltage ($V_{CONTROL}$) to slew-enhancing circuit 410 to dictate the boost current $I_{BOOST}$. The control voltage $I_{CONTROL}$ may determine both the magnitude and the direction of the boost current $I_{BOOST}$. For example, if the input voltages V+ and V− are such that OTA 405 is discharging the capacitive load 310 (i.e., reducing the voltage on electrode 160), the control voltage $I_{CONTROL}$ causes the slew-enhancing circuit to sink the boost current $I_{BOOST}$ to aid in discharging the capacitive load 310. In this example, the boost current $I_{BOOST}$ flows in a direction opposite than the one shown by the arrow in FIG. 4. Moreover, the values of $I_{BOOST}$ and $I_{OTA}$ may be different. For example, the slew-enhancing circuit 410 can be designed to generate a current that is much larger (e.g., an order of magnitude larger) than the current generated by OTA 405.

As will be discussed in greater detail below, the slew-enhancing circuit 410 may include two circuit portions: a charging portion used to source the boost current and a discharging portion used to sink the boost current. The control voltage $I_{CONTROL}$ provided by OTA 405 may determine which portion of the slew-enhancing circuit 410 is currently active. In one embodiment, the value of the control voltage $I_{CONTROL}$ may disable one portion but activate the other. In this manner, the control voltage $I_{CONTROL}$ may synchronize OTA 405 and the slew-enhancing circuit 410 so that both circuits work in tandem to change the voltage on the capacitive load 310. In one embodiment, the control voltage $I_{CONTROL}$ may be an internal biasing voltage used by circuit components in OTA 405 to generate the output current $I_{OTA}$ which is also used to control the circuit components in the slew-enhancing circuit 410. Moreover, OTA 405 may communicate multiple control voltages to the slew-enhancing circuit 410 in order to control $I_{BOOST}$.

Figure 5:
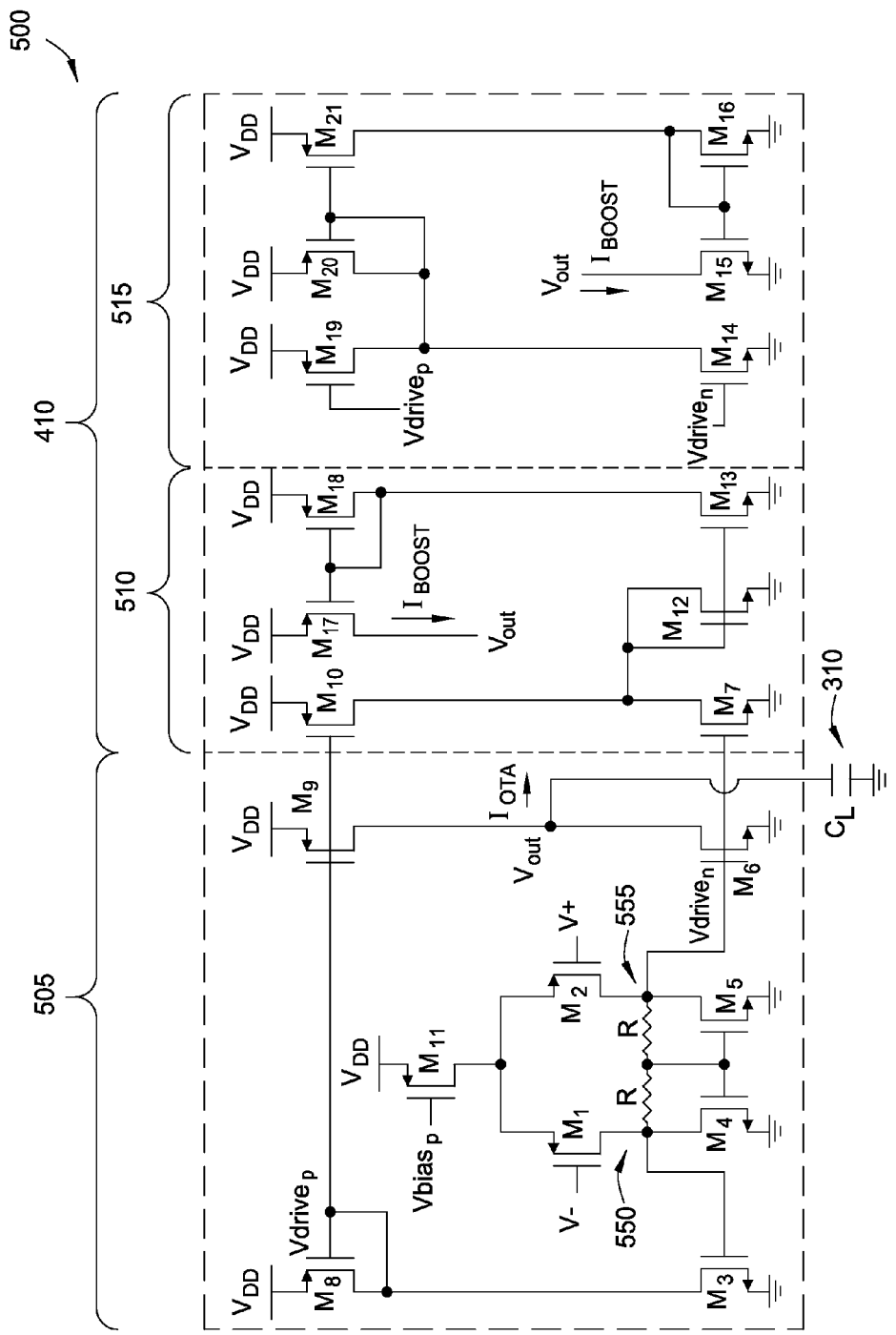
FIG. 5 is a circuit diagram of a class AB operational transconductance amplifier with a slew-enhancing circuit, according to an embodiment described herein.

FIG. 5 is a circuit diagram of a class AB OTA 505 with a slew-enhancing circuit 410, according to an embodiment described herein. Specifically, the class AB OTA 505 may include local common-mode feedback (LCMFB) as shown by the resistors R. Like the OTA 405 in FIG. 4, OTA 505 includes inputs V+ and V− which are used to determine an output current $I_{OTA}$ that charges or discharges the capacitive load 310 and sets the output voltage $V_{OUT}$.

The slew-enhancing circuit 410 includes two portions: charging portion 510 and discharging portion 515. Generally, the charging portion 510 may be active when OTA 505 is charging the capacitive load 310 and inactive when OTA 505 is discharging the capacitive load 310. The reverse is true for the discharging portion 515. Circuit 500 includes a plurality of control voltages that are generated by the OTA 505 that are used to control the charging and discharging portions 510, 515 of the slew-enhancing circuit 410. Here, the internal voltages $Vdrive_p$ and $Vdrive_n$ are control signals (e.g., control voltage $V_{CONTROL}$ shown in FIG. 4) that activate or deactivate charging and discharging portions 510 and 515. Advantageously, the control voltages are already used internally by OTA 505 and thus do not have to be independently generated. That is, in the embodiment shown here, the control voltages used to control the slew-enhancing circuit 410 are also internal signals used by OTA 505 when adjusting $V_{OUT}$.

The following embodiments discuss at least three different modes of operation for OTA 505 and the slew-enhancing circuit 410. The first mode is when V− is less than V+, the second mode is when V− and V+ are similar, and the third mode is when V− is greater than V+. Turning to the first mode, the small voltage on V− and the relatively larger voltage on V+ turns off transistor M2 and turns on transistor M1. Accordingly, most or all of the current from M11 flows through M1. The resistors R create a voltage drop that splits the current exiting from the drain of M1 which flows evenly through transistors M4 and M5. As a result, the voltage at the drain of transistor M1 (node 550) is higher than at the drain of transistor M2 (node 555). The higher voltage at node 550 provides a large bias voltage at transistor M3 but the lower voltage at node 555 provides a relatively lower bias voltage at transistor M6. As a result, transistor M3 wants to sink current more current than transistor M6.

The voltage across the diode connected transistor M8 drops to source the current that M3 wants to sink. This source current is mirrored to transistor M9 (i.e., a current mirror) which also sources the same amount of current. However, as discussed above, transistor M6 does not want to sink much, if any, current. Accordingly, the current sourced by M9 ($I_{OTA}$) flows into the node labeled $V_{OUT}$ and provides charge to the capacitive load 310 thereby increasing the voltage of $V_{OUT}$.

To boost this charging process, the voltage $Vdrive_p$ that controls current mirror M9 is also used to control current mirror M10 in the charging portion 510 of the slew-enhancing circuit 410. Thus, whatever current sourced by M9 is also sourced by M10. In addition, the voltage $Vdrive_n$ that controls transistor M6 is also used to control transistor M7 in the charging portion 510. Because transistor M6 is off or wants to sink a small amount of current, transistor M7 is similarly biased. This results in transistor M10 trying to source a current much larger than the current M7 is trying to sink. Thus, the current sourced by M10 cannot be sunk by transistor M7. Instead, transistor M12 behaves like a diode and the voltage across the transistor M12 adjusts in order to sink the current generated by M10. Specifically, the gate-to-source voltage of M12 increases and the excess current sourced by M10 flows into M12. The gate voltage of M12 is then mirrored to transistor M13 causing this current mirror to want to sink the same amount of current as M12. Transistor M18 sources the current desired by M13 and mirrors its gate voltage to M17. The drain of transistor M17 is coupled to $V_{OUT}$ (i.e., the capacitive load 310) and thus sources the boost current $I_{BOOST}$ to aid in charging the capacitive load 310. In this manner, the control voltage used to cause transistor M9 to source a current ($I_{OTA}$) to the capacitive load 310 is also used to cause transistor M17 to provide an additional current ($I_{BOOST}$) to the same load 310.

In one embodiment, $I_{OTA}$ and $I_{BOOST}$ may have the same or substantially the same value. For example, if the channel resistance of the transistors M9 and M17 are similar (e.g., width (W) and length (L)), then the control signal $Vdrive_p$ causes the sourced currents to be similar. In another embodiment, however, the channel resistance of transistor M17 may be designed to provide a boost current that is larger than the output current sourced by M9. One example of changing the channel resistance is to change the respective W/L ratios of the transistors. For example, the W/L ratio of M17 may be designed as multiple (M) of the W/L ratio of M9 such that $I_{BOOST}=M*I_{OTA}$. Thus, transistor M17 may source a boost current that is much larger (e.g., orders of magnitude larger) than the charging current supplied by the OTA 505 alone. The boost current, however, may be limited to a maximum value if the dimensions of the M17 become so large as to slow the responsiveness of the slew-enhancing circuit 410 below an acceptable value.

While the charging portion 510 is active, control voltages $Vdrive_p$ and $Vdrive_n$ deactivate discharging portion 515. Because $Vdrive_n$ is the gate voltage of transistor M14, this device does not want to sink much current (or any current). In contrast, $Vdrive_p$ cause transistor M19 to want to source a lot of current—i.e., more current than can be sunk by M14. This disparity causes the drain-to-source voltage in transistor M14 to go to VDD which is applied at the gates of transistors M20 and M21 and either shuts off these transistors or causes M20 and M21 to source little current. In turn, little or no current is sunk by M16 which is mirrored to M15. Thus, transistor M15 sinks little or no current from the capacitive load 310—i.e., the discharging portion 515 is inactive and draws very little power.

The second mode of operation for circuit 500 occurs when the voltages of V+ and V− are similar (also referred to as small-signal operation or small-signal condition). In this mode, the current from M11 is split across transistors M1 and M2 resulting in the same voltage at the gates of M3 and M6. Accordingly, M3 and M6 want to sink the same amount of current. Following the analysis above, M8 and M9 source the amount of current sunk by M3 and M6. However, transistors M10 and M7 may be sized such that their DC bias drain voltages are relatively small (e.g., close to ground). This is accomplished by designing M7 to sink more DC current than M10 can source when the input voltages are substantially the same. Thus, when in the second mode of operation, the DC bias drain voltages of M10 and M7 are small relative to ground which turns off the remaining transistors M12, M13, M17, and M18 (i.e., little to no current flows).

The DC bias drain voltages of transistors M19 and M14 in the discharging portion 515 may similarly be designed such that during the second mode of operation, very little or no current flows through transistors M15, M16, M20, and M21. Specifically, the DC bias drain voltages of M19 and M14 may be relatively large (i.e., close to VDD). Accordingly, during small-signal conditions, the voltage at the drains of M19 and M14 approach VDD which results in little to no current flow in M15, M16, M20, and M21.

If the DC bias drain voltages of transistors M7, M10, M19, and M14 are designed as discussed above, then both the charging and discharging portions 510, 515 has a negligible impact on performance. That is, in the second mode of operation, circuit 500 behaves like the slew-enhancing circuit is omitted. This design may also have the advantage of reducing power consumption since the transistors in the slew-enhancing circuit 410 do not draw much or any quiescent power during the second mode of operation. However, designing the DC bias drain voltages of M7, M10, M14, and M19 to have a negligible impact during the second mode of operation is optional. That is, theses transistor may instead have the same dimensions which may increase the power consumed by the slew-enhancing circuit since a non-negligible amount of current may flow in the discharging and charging portions 510, 515 during the second mode of operation.

In the third mode of operation, V− is greater than V+ thereby causing most or all of the current sourced by M11 to flow through M2. The current then splits with half flowing through M4 and the rest flowing through M5. The voltage drop across the resistors R means that node 555 has a higher voltage than node 550. When these respective voltages are applied to the gates of transistors M3 and M6, M3 will sink a small amount of current relative to M6. As discussed above, M8, which is diode connects, sources the small amount of current sunk by M3. This small current is mirrored to M9. However, M6 sinks a relatively large amount of current, of which, little or none is sourced by M9. Instead, the output current $I_{OTA}$ flows from the capacitive load 310 into M6 thereby discharging the capacitive load 310 and decreasing the voltage at $V_{OUT}$.

Simultaneously, the control signal $Vdrive_n$ is provided at the gate of M14 in the discharging portion 515 of the slew-enhancing circuit 410. This control voltage causes M14 to sink a large amount of current which is supplied by the diode connected M20. Because M19 is a current mirror controlled by $Vdrive_p$, which causes M9, M10, and M17 to source a small of current, the current sunk by M14 is provided by M20. The current sourced by M20 is mirrored to M21 and eventually results in M15 sinking current from the capacitive load 310. Here, the drain of M15 is coupled to the capacitive load 310 such that $I_{BOOST}$ pulls charge from the load 310. Much like M17 in the charging portion 510, M15 may have a smaller channel resistance than M6 in order to sink a larger current than OTA 505. For example, M15 may have a W/L ratio that is M times larger than the W/L ratio of M6, thereby sinking a current that is M times larger than the current sunk by M6. In this manner, the discharging portion 515 aids OTA 505 when discharging the capacitive load 310.

While discharging portion 515 is active, the control signals $Vdrive_p$ and $Vdrive_n$ may deactivate charging portion 510. Because $Vdrive_p$ is the gate voltage of transistor M10, this device does not want to source much current (or any current). In contrast, $Vdrive_n$ causes transistor M7 to want to sink relatively more current—i.e., more current than can be sourced by M10. This disparity causes the drain-to-source voltage in transistor M10 to go to ground which is applied at the gates of transistors M12 and M13 and either shuts off these transistors or causes M12 and M13 to source little current. In turn, little or no current is sourced by M18 which is mirrored into M17. Thus, M17 will source little or no current into the capacitive load 310—i.e., the charging portion 510 is inactive.

In sum, the slew-enhancing circuit 410 is configured to operate in three modes. In the first mode, the charging portion 510 is active and sources the boost current to charge the capacitive load 310 while the discharging portion 515 is inactive. In the second mode, the input voltages of the OTA 505 are similar and both the charging and discharging portions 510, 515 may be inactive. Furthermore, the portions 510 and 515 may be designed to have substantially no effect on the capacitive load 310. In the third mode, the discharging portion is active and sinks the boost current to discharge the capacitive load 310 while the discharging portion 515 is inactive.

Figure 6:
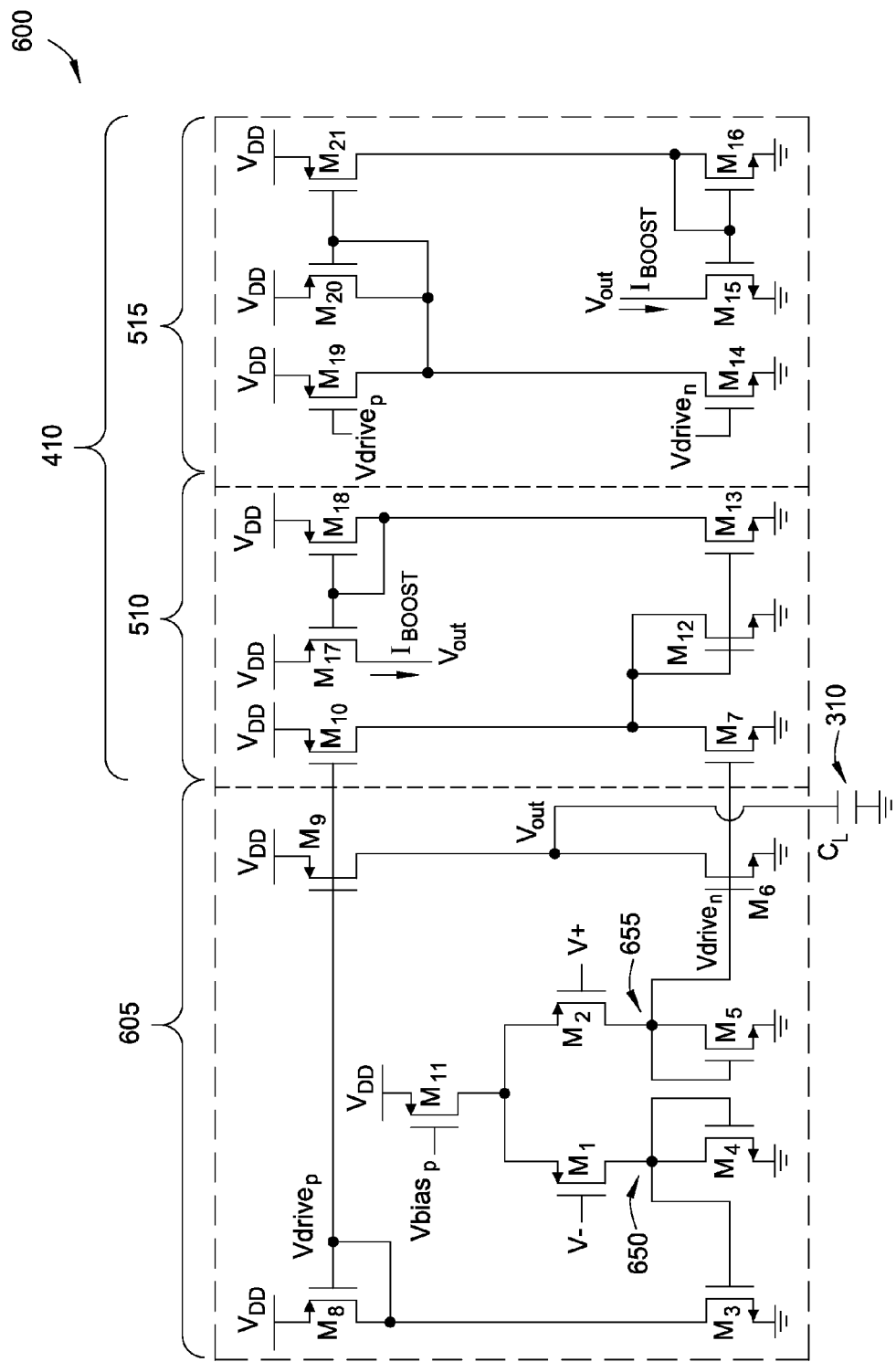
FIG. 6 is a circuit diagram of a class A operational transconductance amplifier with a slew-enhancing circuit, according to an embodiment described herein.

FIG. 6 is a circuit diagram of a class A operational transconductance amplifier 605 with a slew-enhancing circuit 410, according to an embodiment described herein. OTA 605 differs from OTA 505 in FIG. 5 by lacking the resistors R that provide the LCMFB. Instead of the current splitting at nodes 650 or 655 to flow evenly through transistors M4 and M5, most of the current will flow through only one of the transistors depending on whether V− is larger than V+ or V+ is larger than V−. Nonetheless, the operation of OTA 505 is similar to the operation of OTA 605 and will not be discussed in detail for the sake of brevity. Moreover, OTA 605 may be connected to the same slew-enhancing circuit 410 as the one used with the class AB OTA 505 in FIG. 5. Accordingly, FIG. 6 illustrates that the slew-enhancing circuit 410 may be used in either a class A or class AB OTA.

Figure 7:
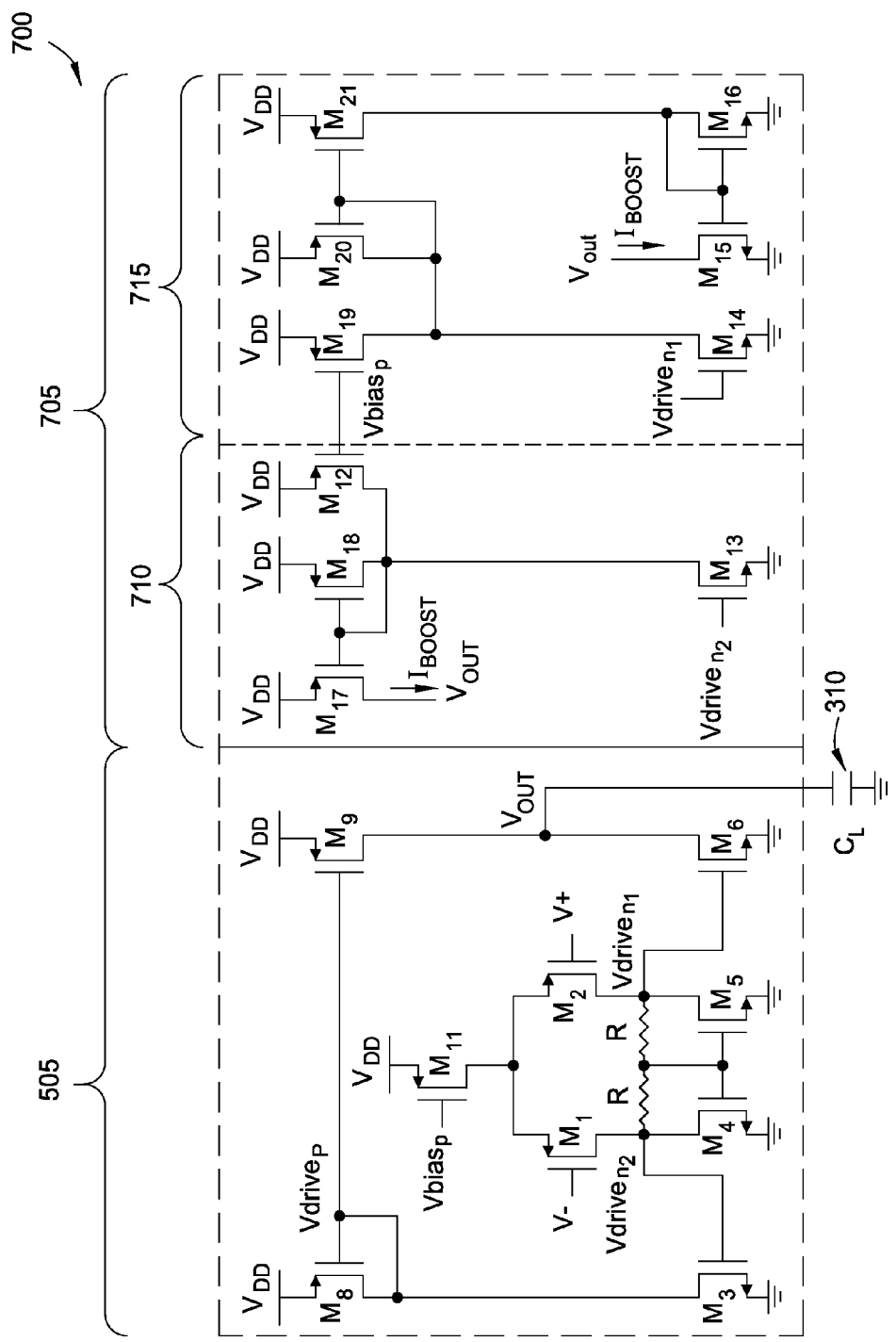
FIG. 7 is a circuit diagram of a class AB operational transconductance amplifier with a slew-enhancing circuit, according to an embodiment described herein.

FIG. 7 is a circuit diagram of OTA 505 with a slew-enhancing circuit 410, according to an embodiment described herein. Circuit 700 includes the LCMFB OTA 505 shown in FIG. 5 but with a different slew-enhancing circuit 705. Specifically, slew-enhancing circuit 705 is designed to limit the transient paths from OTA 505 to the slew-enhancing circuit 705. In contrast to slew-enhancing circuit 410 which uses transient control signals $Vdrive_n$ and $Vdrive_p$ to control four transistors (i.e., M7, M10, M14, and M19), the transient control signals $Vdrive_{n2}$ and $Vdrive_{p2}$ in OTA 505 are used to control only two transistors in the slew-enhancing circuit 705 (i.e., M13 and M14). Instead of using transient signals, transistors M12 and M19 are coupled to DC biasing voltage $Vbias_p$ used by OTA 505 which may remain constant during operation. Despite this change, slew-enhancing circuit 705 operates substantially similar to slew-enhancing circuit 410 in FIG. 5. For example, charging portion 710 of the slew-enhancing circuit 705 is active during the first mode of operation to aid in charging the capacitive load 310 while a discharging portion 715 is inactive. In the third mode of operation, the discharging portion 715 is active to help discharge the capacitive load 310 while the charging portion 710 is inactive. In the second mode of operation, neither the charging portion 710 nor the discharging portion 715 may be active. In this mode, the DC bias drain voltages between M13 and M12 in the charging portion 710 and between M14 and M19 may be adjusted such that little or no boost current is generated by the respective portions 710, 715.

Moreover, slew-enhancing circuit 705 has less transistors than circuit 410 in FIG. 5. Thus, circuit 705 may save space as well as reduce manufacturing costs relative to the slew-enhancing circuit 410 of FIGS. 5 and 6.

Figure 8:
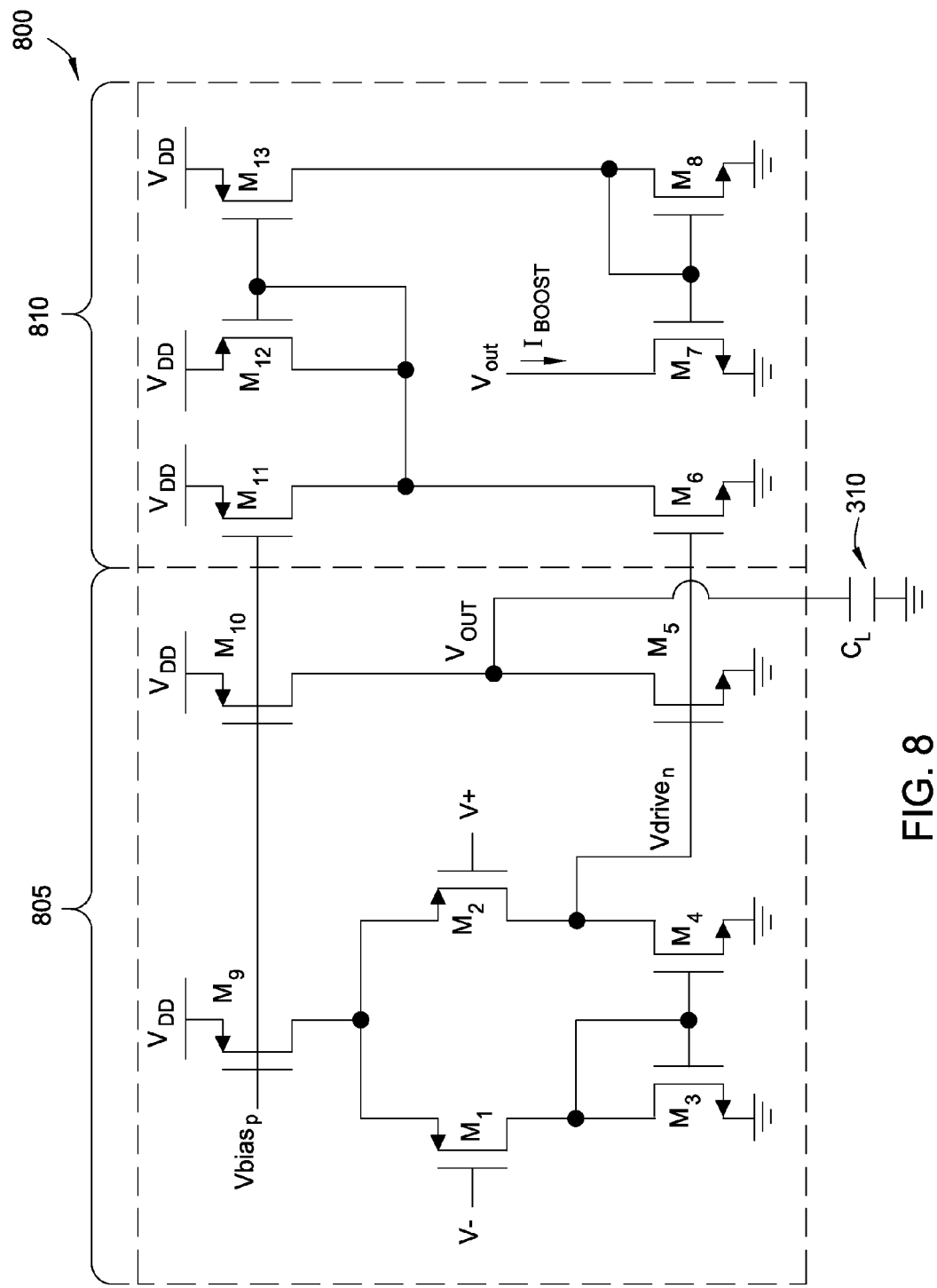
FIG. 8 is a circuit diagram of an operational transconductance amplifier with a slew-enhancing circuit for increasing the slew rate when discharging the capacitive load, according to an embodiment described herein.

FIG. 8 is a circuit diagram of an OTA 805 with a slew-enhancing circuit 810 for increasing the slew rate when discharging the capacitive load 310, according to an embodiment described herein. The OTA 805 shown here is an active load OTA. The slew enhancing circuit 810, however, is designed to only discharge the capacitive load. That is, an input device may use OTA 805 to charge or discharge capacitive load 310 but the slew-enhancing circuit 810 is only activated when the capacitive load 310 is being discharged. Here, the slew-enhancing circuit 810 is similar to the discharging portion 515 of OTA 505 in FIG. 5. That is, the slew-enhancing circuit 810 may only be active and sink a significant amount of current $I_{BOOST}$ when OTA 805 is discharging the capacitive load 310.

In other embodiments, slew-enhancing circuit 810 may be designed based on the discharging portion 715 in FIG. 7. That is, any of the techniques described above for slew-enhancing circuit that functions in three modes of operations may be modified to operate with a one-dimensional amplifier. Furthermore, the slew-enhancing circuit 810 may altered (e.g., "flipped" upside down) so that it operates to aid when the OTA 805 is charging the capacitive load.

Figure 9:
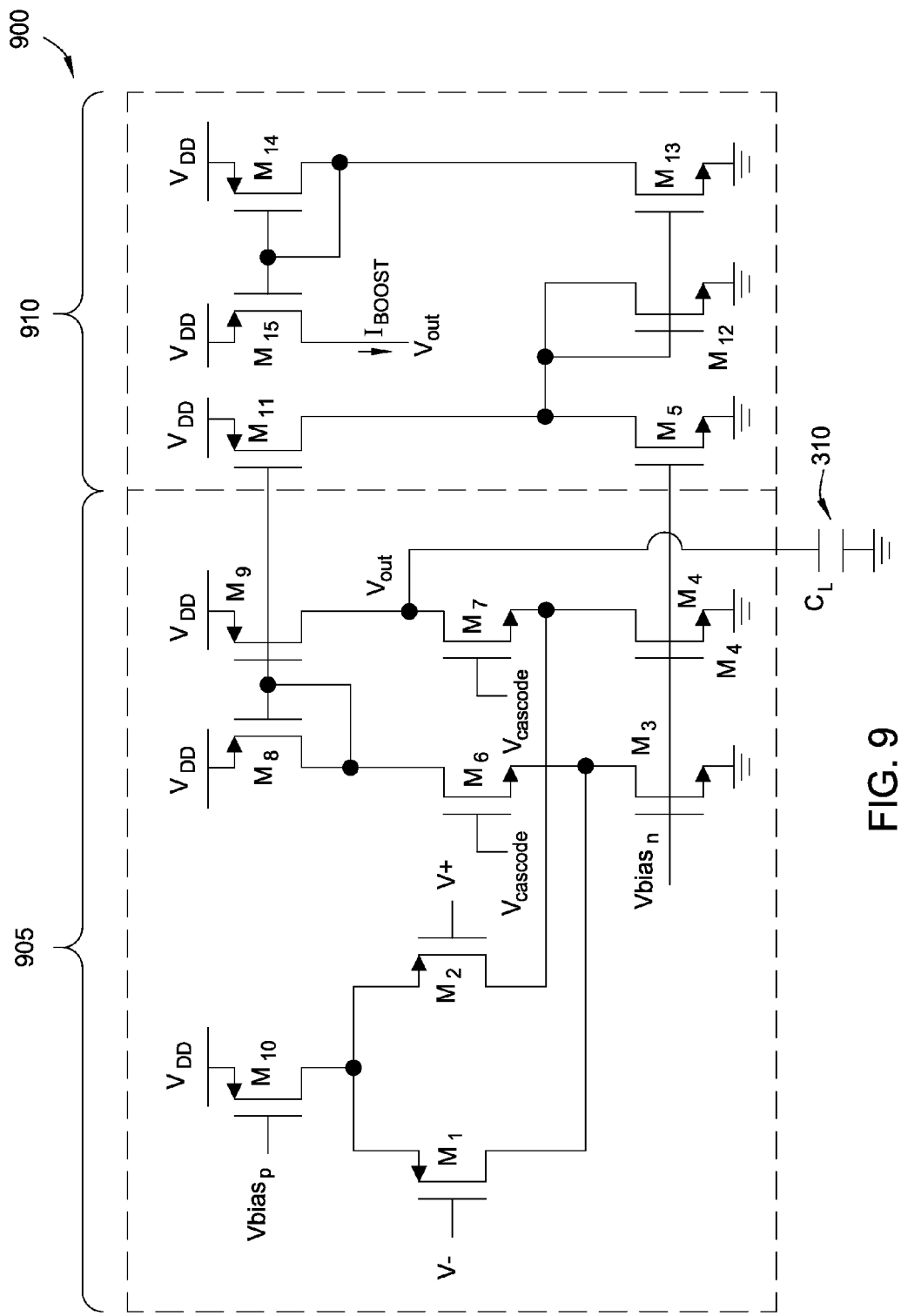
FIG. 9 is a circuit diagram of an operational transconductance amplifier with a slew-enhancing circuit for increasing the slew rate when charging the capacitive load, according to an embodiment described herein.

FIG. 9 is a circuit diagram of an OTA 905 with a slew-enhancing circuit 910 for increasing the slew rate when charging the capacitive load 310, according to an embodiment described herein. The OTA 905 shown here is a folded cascode OTA. The slew enhancing circuit 910, however, is designed to only charge the capacitive load 310 but is inactive when the cascode OTA 905 is discharging the load 310. Slew-enhancing circuit 910 is similar to the charging portion 510 of OTA 505 in FIG. 5, and thus, may only be active and source a significant amount of boost current when OTA 905 is charging the capacitive load 310. In other embodiments, slew-enhancing circuit 910 may be similar to the charging portion 710 in FIG. 7.

FIG. 10 is a timing diagram 1000 illustrating the slew rate of amplifiers with and without the slew-enhancing circuit, according to an embodiment described herein. Specifically, diagram 1000 illustrates different output voltages of OTAs with and without a slew-enhancement circuit and the resulting slew rates. The dotted line illustrates the output voltage of the OTA 605 (i.e., a class A OTA) of FIG. 6 without the slew-enhancement circuit 410. That is, the capacitive load 310 is driven only by the circuit elements in OTA 605 without the aid of slew-enhancing circuit 410. The dashed lines represented the OTA 505 of FIG. 5 (i.e., a class AB OTA) without the slew-enhancement circuit 410. As compared to the dotted line, the slope of the dashed line is greater in that the capacitive load is charged and discharged at a faster rate. Comparing the dotted and dashed lines illustrates one advantage of using a class AB OTA 505 rather than a class A OTA 605 since the class AB OTA 505 is able to approach the desired lower and maximum voltages quicker than the class A OTA 605.

The solid line represents the output voltage of the class AB OTA 505 in FIG. 5 with the addition of the slew-enhancement circuit 410. As shown, the slew-enhancement circuit 410 enables the output voltage to approach the desired upper and lower voltages faster than using the class A and AB OTAs alone (assuming the same input voltages V+ and V−). Moreover, because the dimensions of the transistors used in the slew-enhancement circuit 410 may be designed to provide a multiplicative increase in the amount of current used to charge or discharge the capacitive load 310, the slew rate of the solid line may be increased even further. Although diagram 1000 illustrates that the greatest slew rate is obtained by adding the slew-enhancement circuit to a class AB OTA, the class A OTA 605 may also be similarly improved by adding the slew-enhancement circuit 410.

CONCLUSION

Various embodiments of the present technology provide input devices and methods for improving usability. Specifically, the embodiments are generally directed to improving the slew rate of an amplifier as the amplifier charges or discharges a capacitive load. In one embodiment, the amplifier is coupled to a slew-enhancing circuit which uses a control signal from the amplifier to aid the amplifier when charging or discharging the load. For example, the control signal may be an internal voltage used by the amplifier to control circuit elements within the amplifier. By routing the control signal to the slew-enhancing circuit, the control signal biases the circuit elements within the slew-enhancing circuit to source a boost current when charging the capacitive load or sink the boost current when discharging the capacitive load.

Thus, the embodiments and examples set forth herein were presented in order to best explain the embodiments in accordance with the present technology and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

In view of the foregoing, the scope of the present disclosure is determined by the claims that follow.

We claim:

1. A circuit comprising:
an operational transconductance amplifier (OTA) configured to alter a charge of a capacitive load using an output current;
a slew-enhancing circuit; and
a signal line configured to transmit a control signal from the OTA to a switching element in the slew-enhancing circuit, wherein the slew-enhancing circuit is configured to use the control signal to generate a boost current that is separate from the output current to alter the charge of the capacitive load.

2. The circuit of claim 1, wherein the slew-enhancing circuit comprises:
a charging portion configured to source the boost current and charge the capacitive load; and
a discharging portion configured to sink the boost current and discharge the capacitive load.

3. The circuit of claim 2, wherein the control signal selectively activates and deactivates the charging portion and the discharging portion such that the charging and discharging portions are not activated simultaneously.

4. The circuit of claim 1, wherein the control signal is an internal voltage used by the OTA to bias one or more switching elements when generating the output current.

5. The circuit of claim 1, wherein the slew-enhancing circuit comprises at least one current mirror configured to mirror a biasing current in response to a bias applied to the switching element using the control signal.

6. The circuit of claim 1, wherein the slew-enhancing circuit further comprises at least one switching element having a gate to width ratio that multiplies the boost current relative to the current output from the OTA.

7. An integrated circuit comprising:
an operational transconductance amplifier (OTA) configured to alter a charge of a capacitive load using an output current;
a slew-enhancing circuit; and
a signal line configured to transmit a control signal from the OTA to a switching element in the slew-enhancing circuit, wherein the slew-enhancing circuit is configured to use the control signal to generate a boost current that is separate from the output current to alter the charge of the capacitive load, wherein the OTA, the slew-enhancing circuit, and the signal line are integrated onto a chip.

8. The integrated circuit of claim 7, wherein the slew-enhancing circuit comprises:
a charging portion configured to source the boost current and charge the capacitive load; and
a discharging portion configured to sink the boost current and discharge the capacitive load.

9. The integrated circuit of claim 8, wherein the control signal selectively activates and deactivates the charging portion and the discharging portion such that the charging and discharging portions are not activated simultaneously.

10. The integrated circuit of claim 7, wherein the control signal is an internal voltage used by the OTA to bias one or more switching elements when generating the output current.

11. The integrated circuit of claim 7, wherein the slew-enhancing circuit comprises at least one current mirror configured to generate a biasing current in response to a bias applied to the switching element using the control signal.

12. The integrated circuit of claim 7, wherein the slew-enhancing circuit further comprises at least one switching element having a gate to width ratio that multiplies the boost current relative to the current output from the OTA.

13. A method for changing the slew rate associated with an operational transconductance amplifier (OTA) coupled to a capacitive load,
    transmitting a control signal from the OTA to a slew-enhancing circuit;
    biasing a switching element in the slew-enhancing circuit using the control signal;
    generating a boost current, separate from an output current from the OTA, in response to biasing the switching element using the control signal; and
    providing the boost current from the slew-enhancing circuit and the output current to the capacitive load.

14. The method of claim 13, wherein the slew-enhancing circuit comprises:
    a charging portion configured to source the boost current and charge the capacitive load; and
    a discharging portion configured to sink the boost current and discharge the capacitive load.

15. The method of claim 14, wherein the control signal selectively activates and deactivates the charging portion and the discharging portion such that the charging and discharging portions are not activated simultaneously.

16. The method of claim 13, wherein the control signal is an internal voltage to bias one or more switching elements in the OTA when generating the output current.

17. The method of claim 13, wherein biasing the switching element using the control signal generates a biasing current that is mirrored using at least one current mirror in the slew-enhancing circuit.

18. The method of claim 13, wherein substantially no quiescent power is drawn by the slew-enhancing circuit when input voltages of the OTA are substantially equal.

19. The method of claim 13, wherein the output current from the OTA and the boost current from the slew-enhancing circuit simultaneously change a charge on the capacitive load, wherein the boost current is greater than the output current generated by the OTA.

20. The method of claim 19, wherein at least one switching element in the slew-enhancing circuit has a gate to width ratio that multiplies the boost current relative to the output current from the OTA.

* * * * *